United States Patent
Yang

(10) Patent No.: US 7,511,332 B2
(45) Date of Patent: Mar. 31, 2009

(54) VERTICAL FLASH MEMORY

(75) Inventor: Shih-I Yang, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 499 days.

(21) Appl. No.: 11/212,739

(22) Filed: Aug. 29, 2005

(65) Prior Publication Data

US 2007/0045709 A1  Mar. 1, 2007

(51) Int. Cl.
 *H01L 29/788* (2006.01)
(52) U.S. Cl. .................... 257/316; 257/E29.3
(58) Field of Classification Search .............. 257/213, 257/288, 296, 314, 315, 316, 317, 318, 319, 257/320, 321, 322, 323, 324, 325, 326, 327, 257/328, 329, 330, 331, 332, E29.3
See application file for complete search history.

(56) References Cited

U.S. PATENT DOCUMENTS 5,366,910 A * 11/1994 Ha et al. ............... 438/158
5,943,267 A    8/1999 Sekariapuram et al.
5,990,509 A * 11/1999 Burns et al. ............ 257/296
6,143,636 A * 11/2000 Forbes et al. ............ 438/587
6,177,699 B1   1/2001 Perng et al.
6,424,001 B1   7/2002 Forbes et al.

* cited by examiner

*Primary Examiner*—Evan Pert
*Assistant Examiner*—Kevin Quinto
(74) *Attorney, Agent, or Firm*—Birch, Stewart, Kolasch & Birch, LLP

(57) ABSTRACT

A vertical array of flash memory cells. Transistor bodies are disposed on a substrate, comprising a source, channel and drain region, stacked thereon. Two joint gate structures are disposed on opposite sidewalls of every two transistor bodies respectively, and include a joint tunnel oxide layer disposed conformally on sidewalls of the two transistor bodies and the substrate there between, two floating gates on the opposite sidewalls of the tunnel oxide layer, a joint insulating layer covering the floating gates and the substrate there between, and a joint control gate layer on the sidewalls of the transistor bodies and the substrate there between. A dielectric layer covers the transistor bodies, where bit lines and word lines are disposed therein in contact with the top surfaces of the transistor bodies and the control gates between every two transistor bodies respectively. Source lines are disposed in the substrate to contact the source regions.

13 Claims, 17 Drawing Sheets

VERTICAL FLASH MEMORY

BACKGROUND

The present invention relates to integrated circuits, and in particular to flash memory cells with vertical transistors.

Semiconductor memories are widely used for data storage. As logic devices, the density of memory cells is typically limited by a minimum lithographic feature size imposed by lithographic processes used during fabrication. However, increasing demand for data storage capacity of semiconductor memories requires a reduction in the size of access FETs and storage capacitors in memory cells.

Flash memory, a member of the non-volatile class of memory storage devices, retains its data even when power is removed, and achieves higher density and lower cost through traditional silicon process scaling techniques, such as feature size reduction. In addition, flash memory also provides superior electrical reading, erasion, and programming in the host system, without requiring removal. Currently, flash memory devices are widely found in PCs and cellular phones and are a key component of the emerging digital imaging and audio markets.

FIG. 1A shows a physical layout of a conventional flash memory cell, a modified NMOS transistor with a floating gate. In a flash memory cell, a thin layer of oxide is deposited as tunnel oxide on top of a channel area on a p-type silicon substrate (P—Si). A layer of poly-silicon is deposited on top of the tunnel oxide as a floating gate (FG). Another layer of oxide is deposited on top of the floating gate (FG) as an isolation layer. A front metal-based gate is deposited on top of the isolation oxide for voltage control, i.e. a control gate (CG). The silicon substrate (P—Si) beside the gate structure is doped with n-type ions to serve as source/drain regions (S/D). Because the floating gate is insulated by oxide, negative charge thereon is contained, even if power is interrupted.

FIG. 1B shows a circuit symbol of the flash memory cell in FIG. 1A. The raw states of a flash memory comprise 1's, since each floating gate carries no negative charges. FIG. 1C shows a partial matrix of flash memory cells. Word lines (WL) are disposed along an X-axis and bit lines (BL) along a y-axis. Flash memory cells at the intersection have control gates connected to WLs (i.e. the decoded address), drains connected to BLs, and sources connected to SLs (source lines). The SLs are connected to a common ground. The voltage combinations applied to WL and BL define an operation: read, erase, or program.

Similarly, conventional flash memory cells are also limited by a minimum lithographic feature size. Since there is an increasing demand for high capacity storage devices, there is a need to develop denser flash memory devices.

SUMMARY

One object of the present invention is to provide a vertical flash memory cell structure.

Another object of the present invention is to provide a stackable flash memory array to increase storage capacity.

To achieve the objects, the present invention provides a flash memory cell with a vertical construction. A source region, channel region and drain region are stacked on a substrate sequentially, acting as a transistor body. A tunnel oxide layer is disposed on a sidewall of the transistor body. A floating gate is disposed on the tunnel oxide layer above the source and channel regions, with the top thereof between the upper and bottom surface of the channel regions. An insulating layer covers the floating gate and a control gate is disposed on the insulating layer, isolated from the floating gate by the insulating layer and from the transistor body by the tunnel oxide layer, with the control gate covering the upper surface of the channel region.

Based on the vertical flash memory cell, the present invention further provides an array of vertical flash memory cells and method for fabricating the same. An array of transistor bodies are disposed on a substrate, each comprising a source region, a channel region and a drain region, stacked on the substrate in sequence, each transistor body having a top surface and a pair of sidewalls. Two joint gate structures are disposed on opposite sidewalls of every two adjacent transistor bodies respectively, including a joint tunnel oxide layer disposed conformally on the opposite sidewalls of the two transistor bodies and the substrate between the transistor bodies, two floating gates disposed on opposite sidewalls of the tunnel oxide layer respectively and above the source and channel regions, with the top thereof between the upper and bottom surface of the channel regions, a joint insulating layer conformally covering the two opposite floating gates between the two transistor bodies and the substrate there between, and a joint control gate layer disposed over opposite sidewalls of the transistor bodies and the substrate there between, isolated from the floating gates by the insulating layer and from the transistor bodies by the tunnel oxide layer, with each control gate covering the upper surface of the channel region. A dielectric layer substantially fills gaps and covers the surface of the transistor bodies. Bit lines are disposed in the dielectric layer, in contact with the top surfaces of the transistor bodies, and word lines are disposed in the dielectric layer, in contact with the control gates on the bottom of every two adjacent transistor bodies via word line contact plugs. Source lines are disposed in the substrate, in contact with the source regions of the transistor bodies.

Based on the array of vertical flash memory cells, the present invention further provides a multi-level structure of flash memory arrays. A first level of the array of vertical flash memory cells as previously described are disposed on a substrate. A second level of the same array of vertical flash memory cells is then disposed on the first level. Thus, a stackable flash memory device with increased storage capacity is achieved.

The present invention further provides an electronic system, including a processor and the array of vertical flash memory cells.

A detailed description is given in the following, with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

FIGS. 2 to 15 show fabrication of a partial array of vertical flash memory cells according to the invention. A complete array of vertical flash memory cells of the invention can be extrapolated accordingly.

Figure 1A:
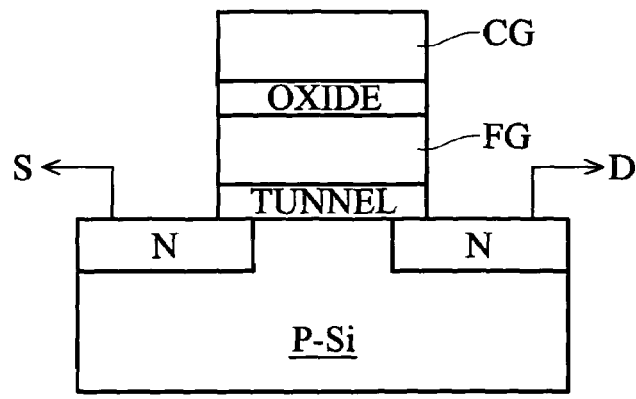
FIGS. 1A to 1C show a physical layout of a conventional flash memory cell, a circuit symbol thereof and a partial matrix of the flash memory cells respectively.
Figure 1B:
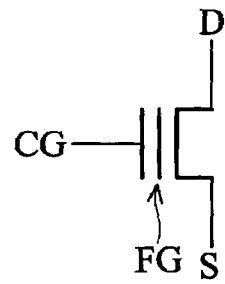
Figure 1C:
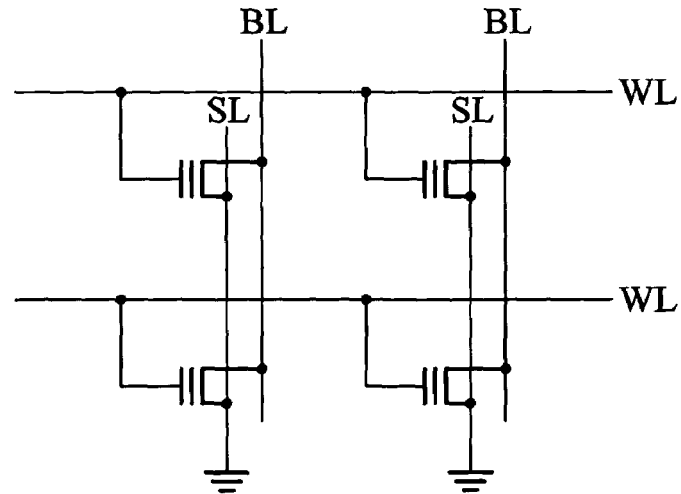
Figure 2:
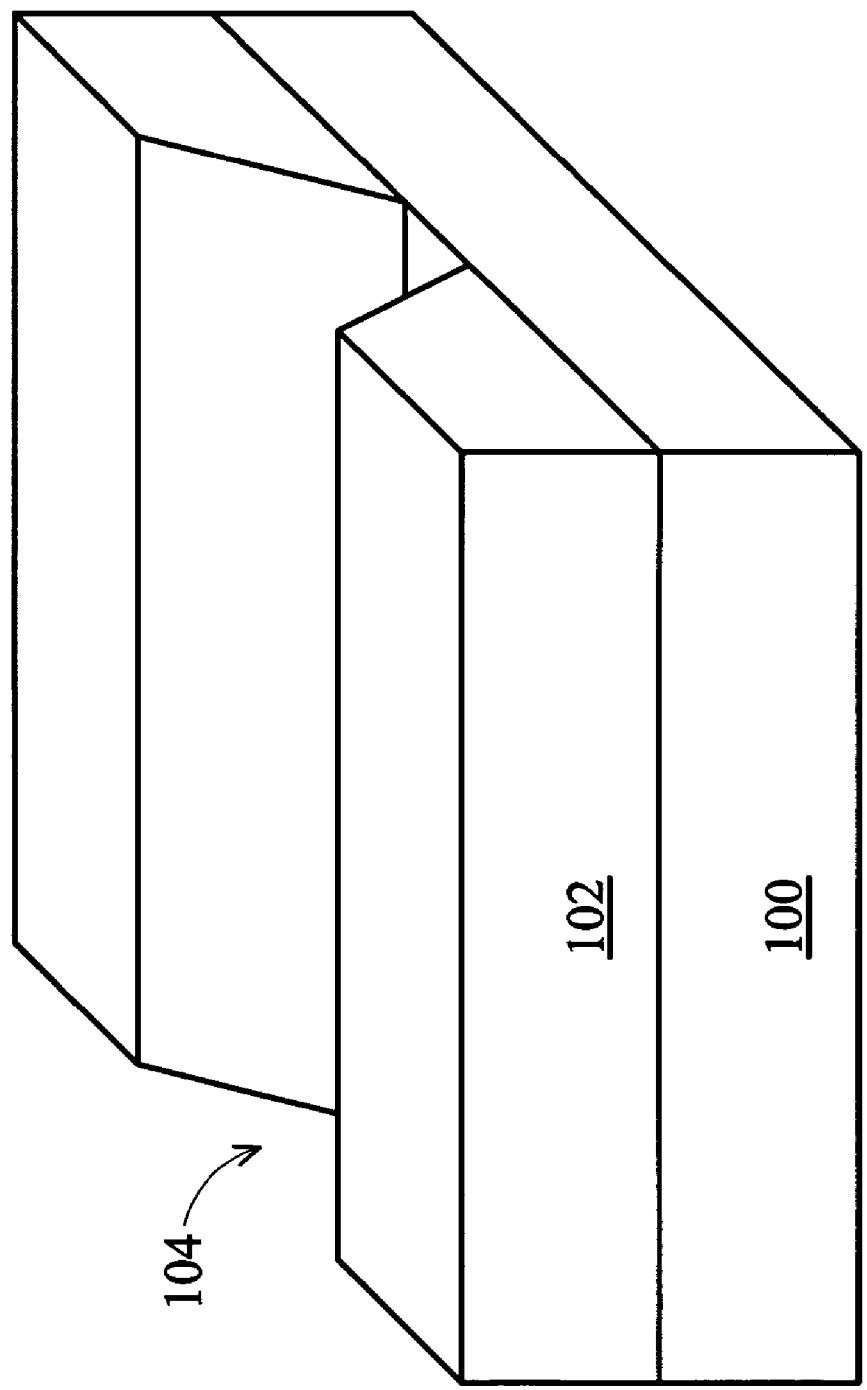
FIGS. 2 to 15 show fabrication of a partial array of vertical flash memory cells according to the invention.

As shown in FIG. 2, an insulating layer 102 is blanketly formed on a substrate 100, e.g. a semiconductor silicon substrate. The insulating layer 102 can be silicon oxide or the like deposited by CVD, spin-on-dielectric or thermal oxidation. The insulating layer 102 is then patterned and etched to form a trench line 104 with a depth from 1000 to 2000 Å.

Figure 3:
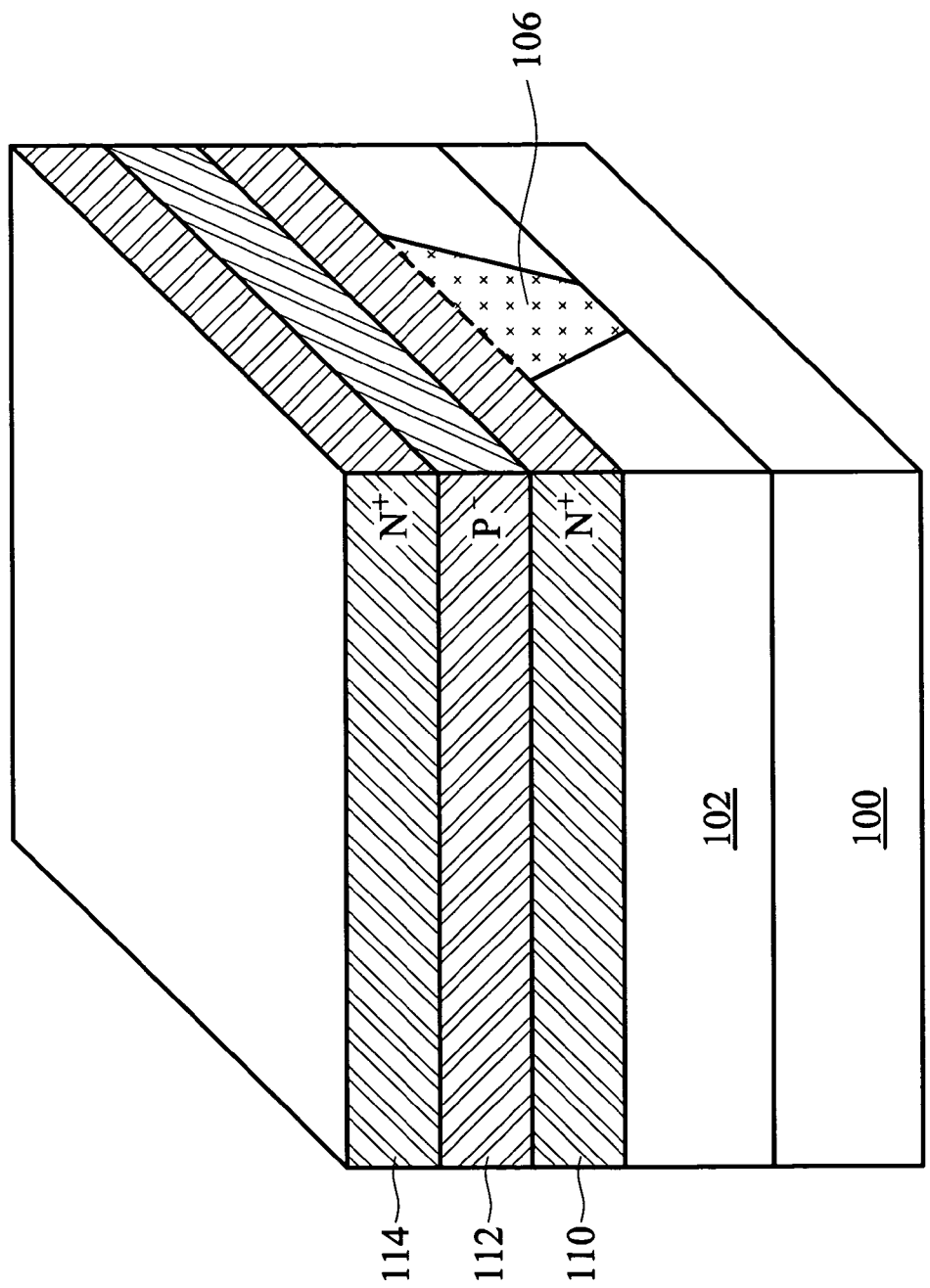

A first semiconducting layer, e.g. a polysilicon or epitaxial silicon layer, is formed on the insulating layer 102 and simultaneously fills the trench lines for interconnection as a source line 106. The polysilicon layer can be formed by LPCVD (low pressure chemical vapor deposition) with silane as the source gas. The epitaxial silicon layer can be formed by high-temperature CVD with silane, dichlorosilane, or trichlorosilane as the source gas. Preferably, the first poly silicon or epitaxial silicon layer 106 is in-situ doped during the deposition by adding N-type dopant, e.g. arsine ($AsH_3$) and phosphine ($PH_3$), or P-type dopant, e.g. diborane ($B_2H_6$), to the gas mixture. The doped polysilicon or epitaxial silicon layer 106 on the surface of the insulating layer 102 can be further planarized by chemical mechanical polishing (CMP) or the like to form a common source line 106, as shown in FIG. 3. After cleaning native oxide of source line surface, a sandwich-like structure is further constructed based on the layer 102. Three layers of semiconductor, e.g. polysilicon or epitaxial silicon, 110, 112 and 114 are deposited sequentially on the layer 102 by similar process. The first, second and third semiconducting layers 110, 112 and 114 are also in-situ doped. The dopant introduced into the first and third semiconducting layers 110 and 114 should be doped opposite to that of the second semiconducting layer 112. As shown in FIG. 3, the first and third semiconducting layers 110 and 114 are doped with n-type ions and the second semiconducting layer 112 is doped with P-type ions.

Figure 4:
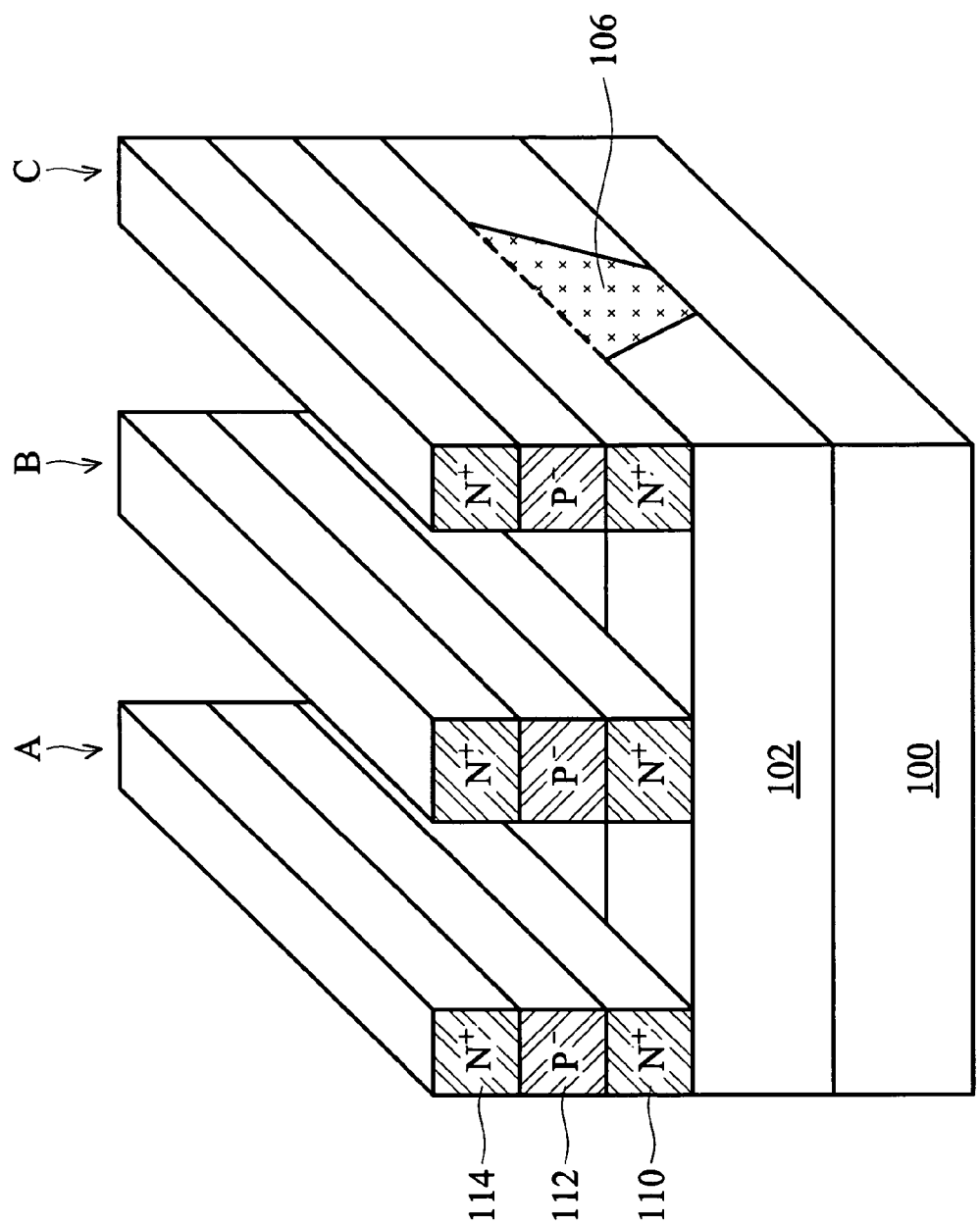

The tri-layer structure (110, 112 and 114) is patterned and etched as three parallel vertical transistor strips A, B and C, across the source line 106. As shown in FIG. 4, each transistor strip is composed of a vertical n-p-n transistor structure, wherein the n-type layer 110, p-type layer 112 and n-type layer 114 serve as source, channel, and drain regions respectively.

Figure 5:
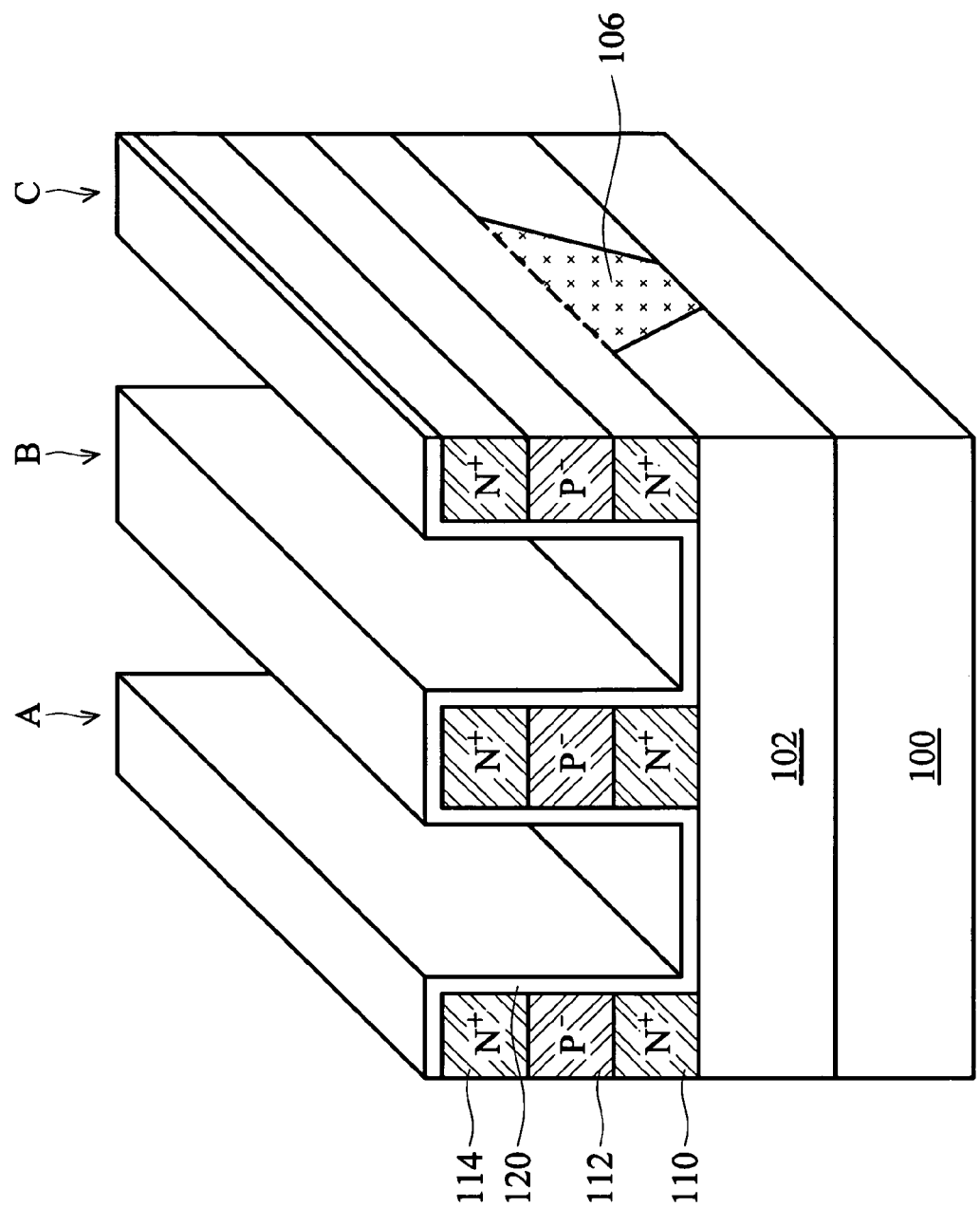

In FIG. 5, a tunnel dielectric layer is formed, covering the surface of every transistor strips. In an embodiment, the substrate can be subjected to thermal treatment to form an oxide film conformally on the surface and sidewalls of the transistor strips A, B and C and the exposed source line between transistor strips, which serves a joint tunnel dielectirc layer 120 between every two transistor strips. In another embodiment, the tunnel dielectric layer 120 is formed by CVD. The preferred thickness of the tunnel oxide layer 120 may around 80 angstrom.

Figure 6:
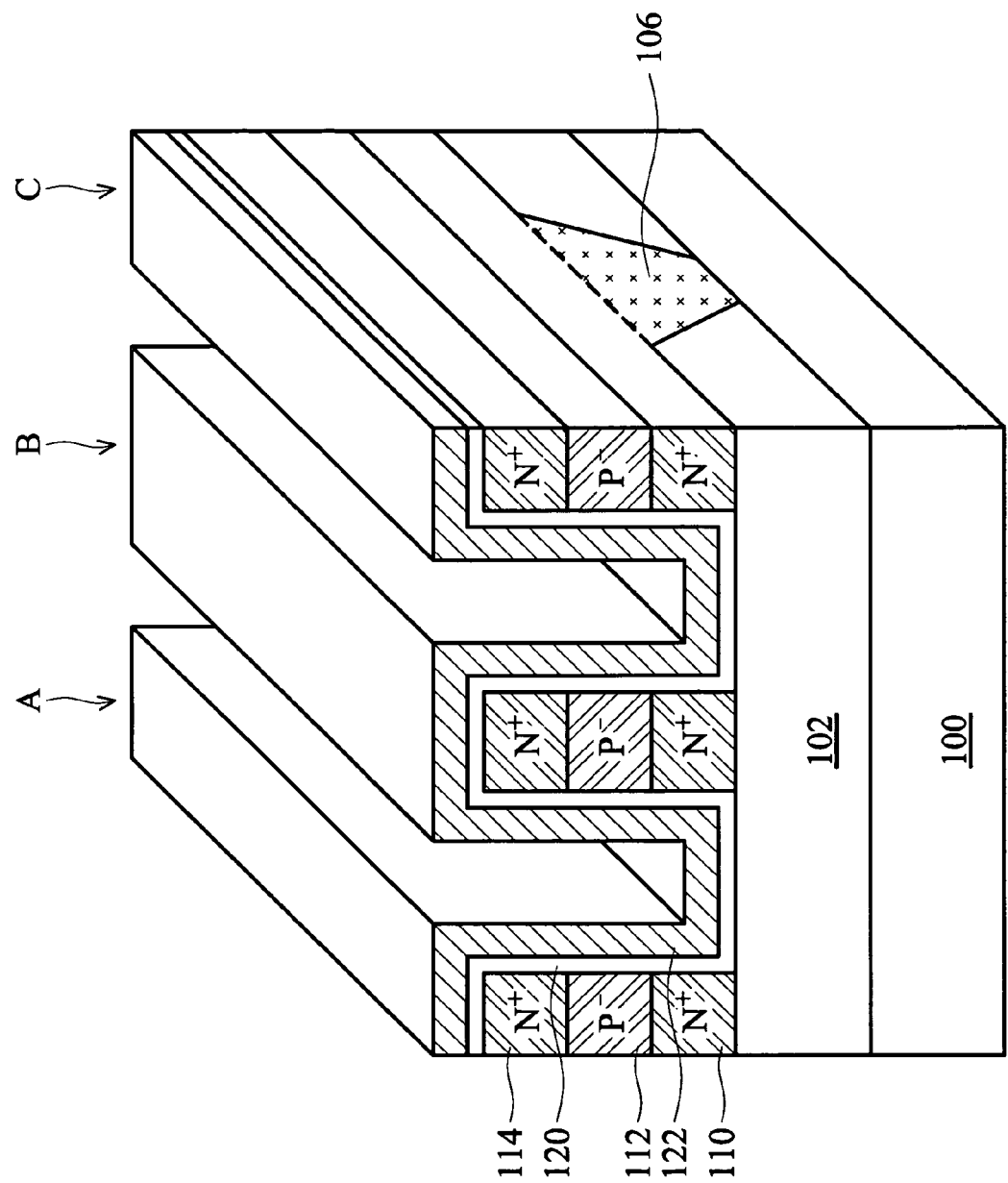
Figure 7:
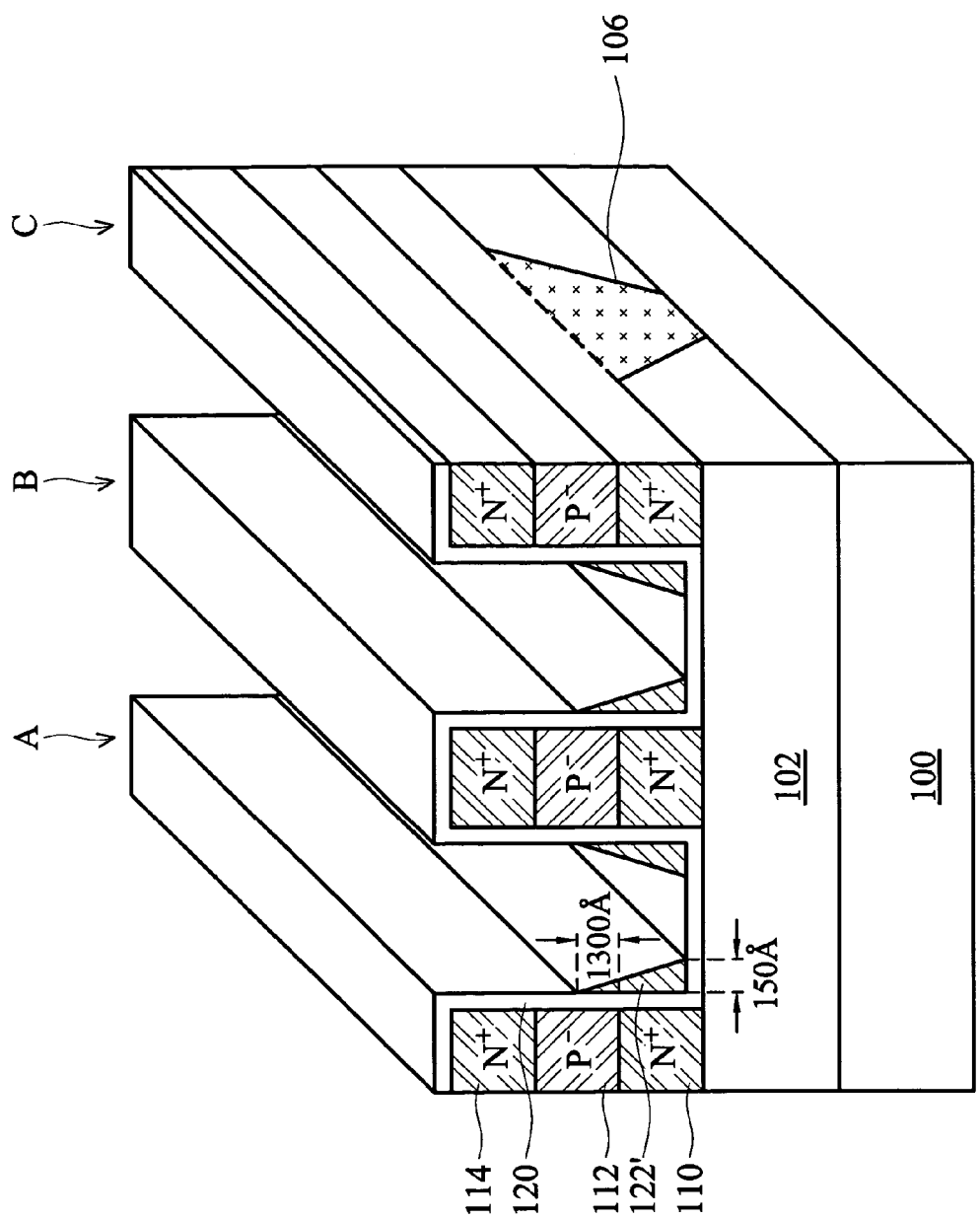

In FIG. 6, a conductive layer, e.g. polysilicon, 122 is deposited conformally on the tunnel oxide layer 120. The conductive layer 122 is then blanket-recessed by removal of the conductive layer from the surface of the transistor bodies A, B and C, and that in the central area of tunnel oxide layer 120 between every two transistor strips. Thus, two spacer-like conductive layers remain, serving as two floating gates 122', on the opposite sidewalls of every two adjacent transistor strips, as shown in FIG. 7. To control the shape and height of spacer-like conductive layers, a spin-on material of etching protection such as photo-resist or organic ARC (Anti-reflection Coating) could be introduced. Moreover, the tunnel oxide layer 120 between every two opposite floating gates 122' is also exposed. The top of floating gates 122' is between the upper and bottom surface of the adjacent channel region 112. The preferred height of floating gates 122' is about 0.28 um, which is higher than the bottom surface of channel region for about 0.13 um. Moreover, the remaining thickness is around 150 A.

Figure 8:
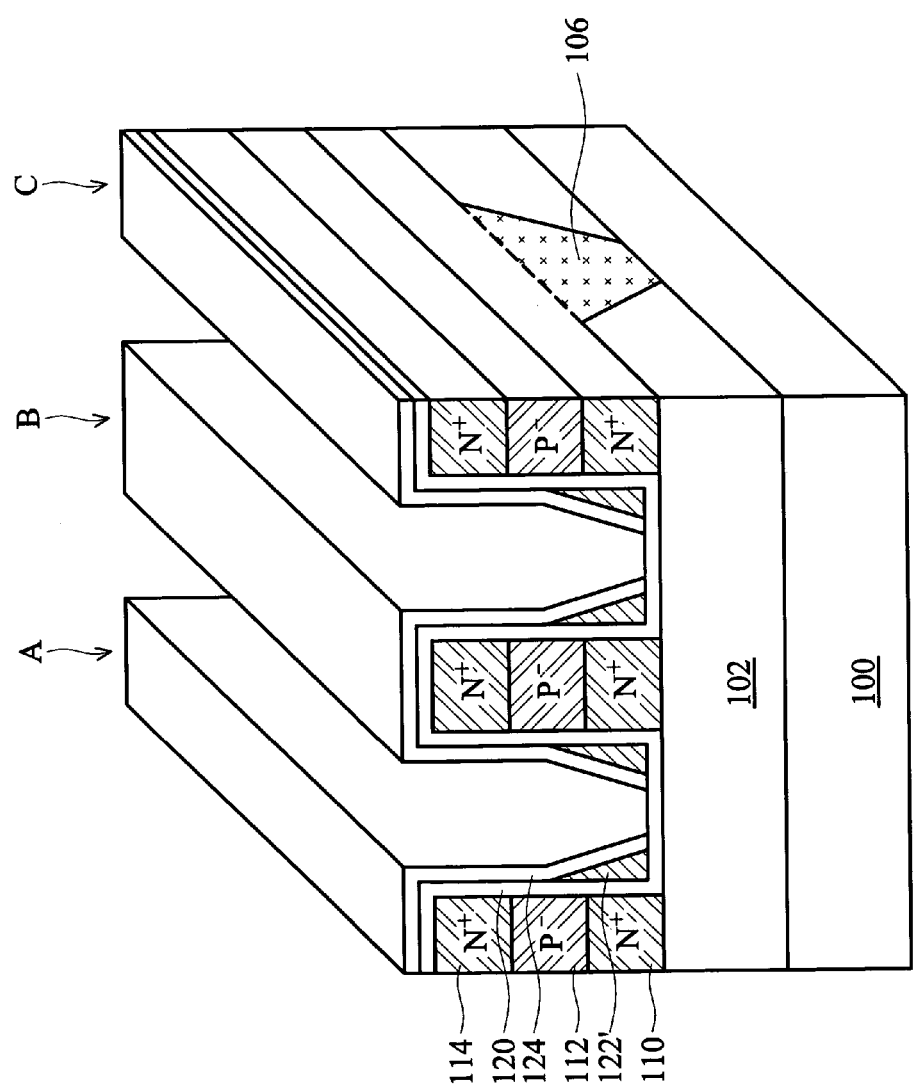

As shown in FIG. 8, an insulating layer is formed conformally on the tunnel oxide layer 120 and the floating gates 122', which serves as a joint control gate oxide layer 124 between every two adjacent transistor strips. The control gate oxide 124 can be formed by high temperature oxidation (HTO), annealing or conventional oxide deposition, with a preferred thickness about 140 angstrom.

Figure 9:
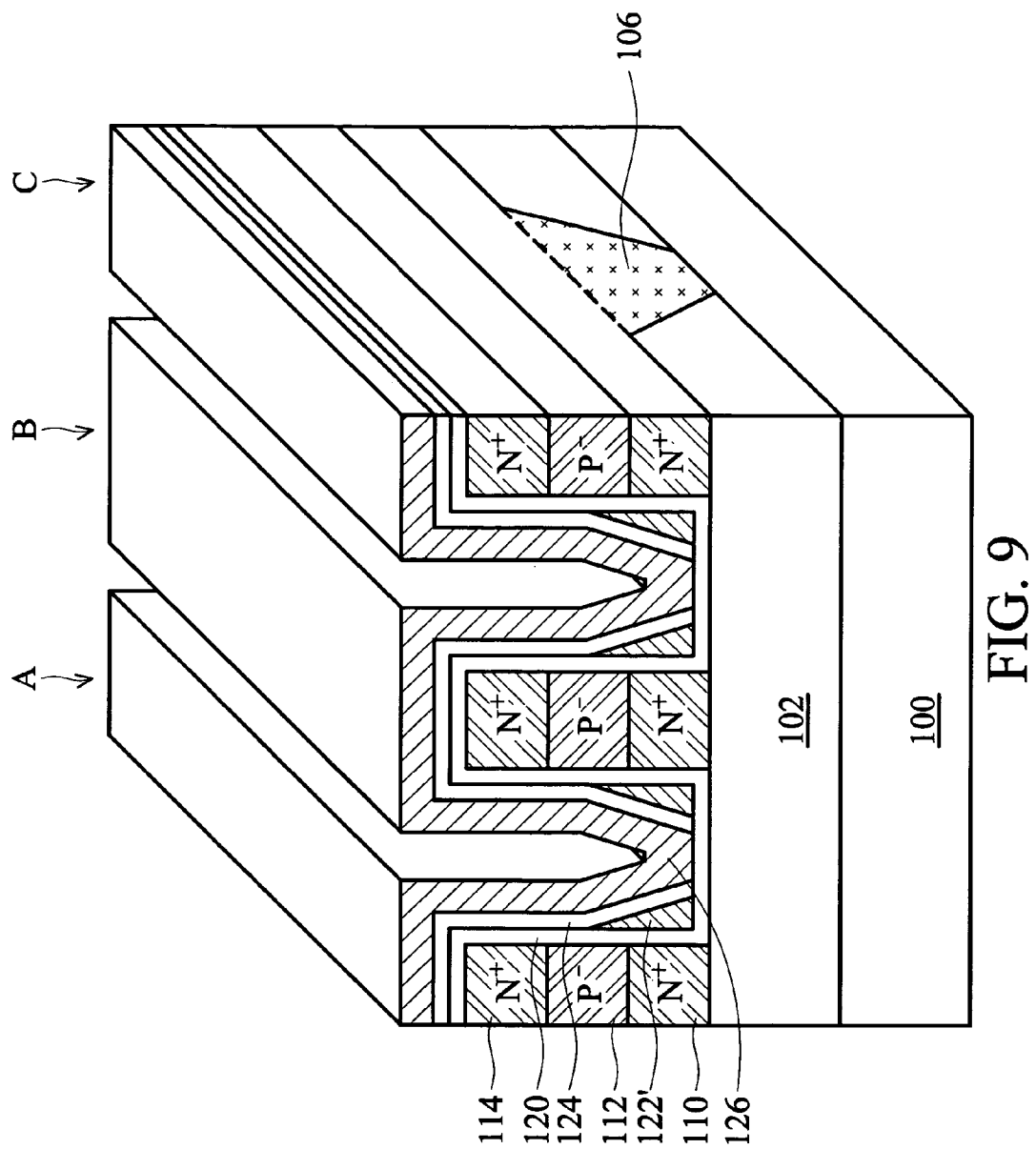
Figure 10:
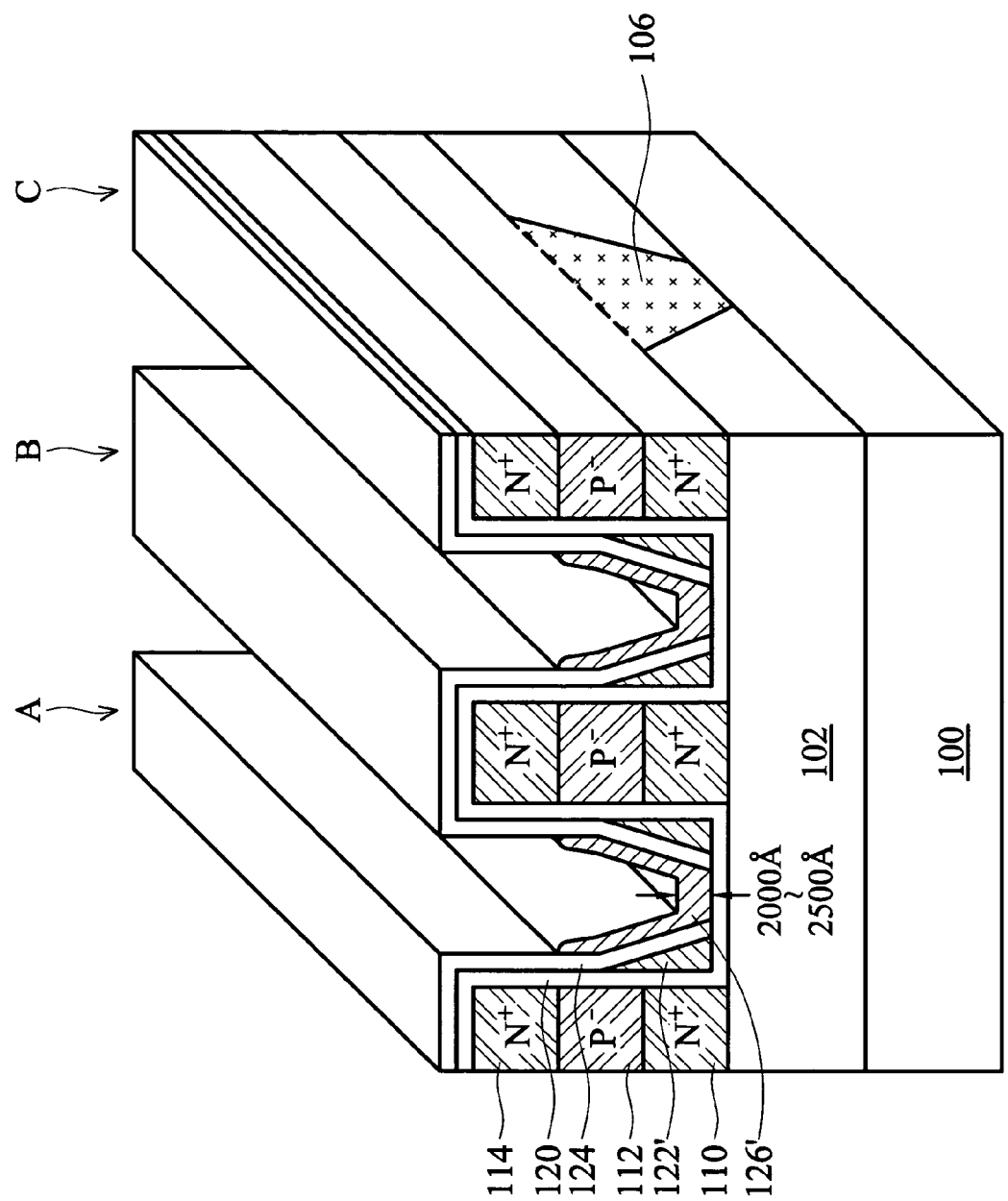

In FIG. 9, a conductive layer 126, e.g. a polysilicon layer, is conformally deposited with a thickness about 3000 angstrom on the surface of the control gate oxide 124. The conductive layer 126 is then blanket-recessed to remove the conductive layer from the surface of the transistor strip A, B and C, and thin the conductive layer 126 between every two transistor strips conformally. To control the shape and height of this conductive layer, a spin-on material of etching protection such as photo-resist or organic ARC could be introduced. After recessing, a joint spacer-like control gate 126' is formed between every two transistor bodies, as shown in FIG. 10. The top of the joint control gates 126' between every two transistor strips is at the bottom surface of the adjacent drain region 114. The control gates 126' should cover the channel region 112 and the floating gates 122' and not be over the upper surface of the channel region 112, as shown in FIG. 10. The preferred height of control gates 126' is 0.65 um. Moreover, the thickness could be kept around 2000~2500 angstrom with very low loss by the assist of spin-on material.

Figure 11:
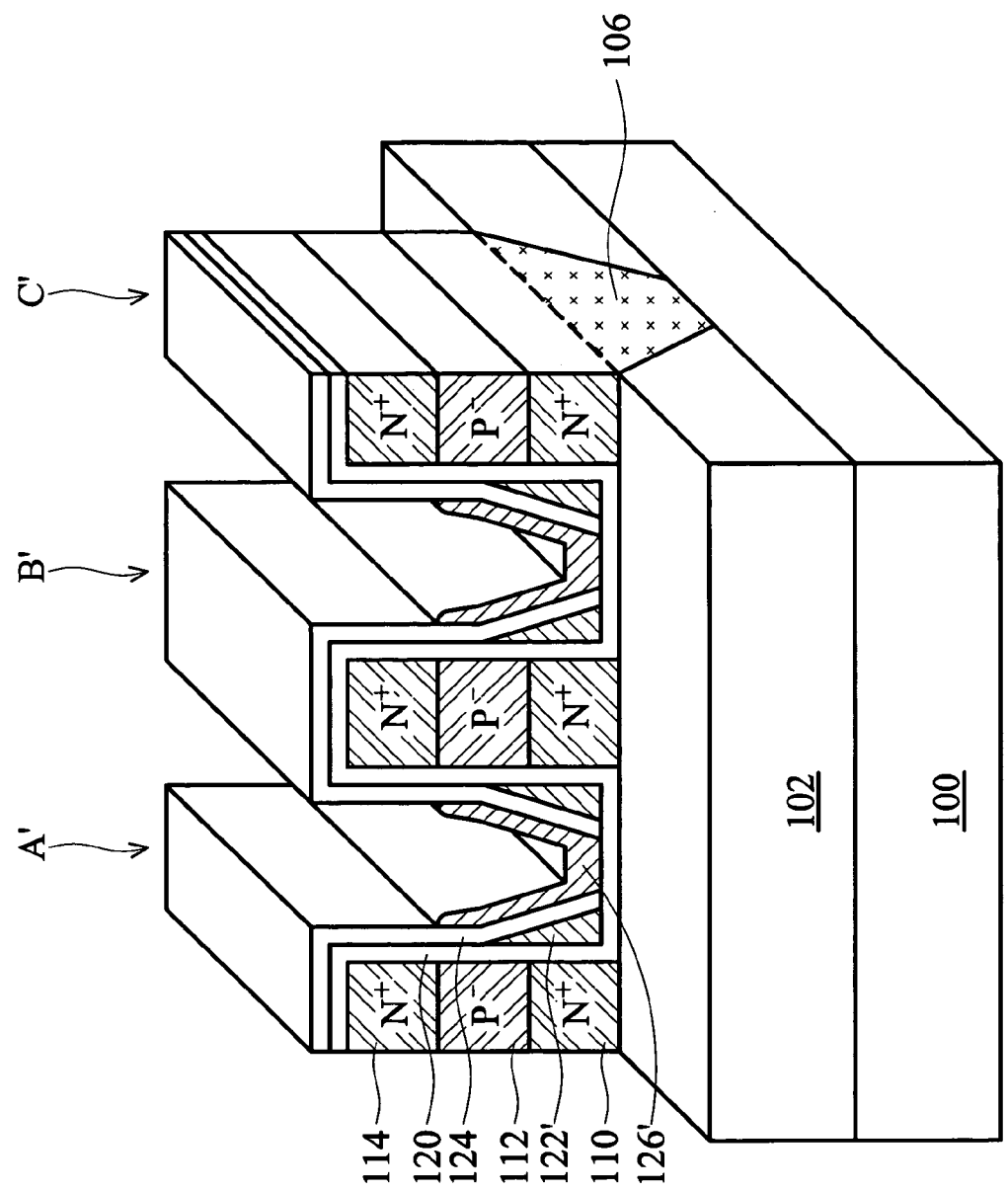

In FIG. 11, the transistor strips A, B and C, the control gate 126', control gate oxide 124, floating gate 122' and tunnel oxide 120 are patterned and etched to form three vertical transistor bodies A', B' and C', directly above the underlying source line 106. The insulating layer 102 beside the source line 106 is then exposed. As shown in FIG. 11, there are four vertical flash memory cells, forming a partial array of flash memory. Each vertical flash memory cell is composed of a vertical transistor body with a stacked source (110), channel (112) and drain region (114), and the gate structure beside it, which includes a pair of floating gate 122' floating between the tunnel oxide 120 and the control gate oxide 124, and a joint control gate 126' on the control gate oxide 124. Along the sidewall of the transistor body, the top of the floating gate 122' is between the upper and bottom surface of the channel region 112 and the top of the control gate 126' is between the upper and bottom surface of the drain region 114. Moreover, floating gate 122' and joint control gate 126' are isolated from the underlying source line by tunnel oxide 120.

The interconnection between the vertical flash memory cells is further described as follows.

Figure 12:
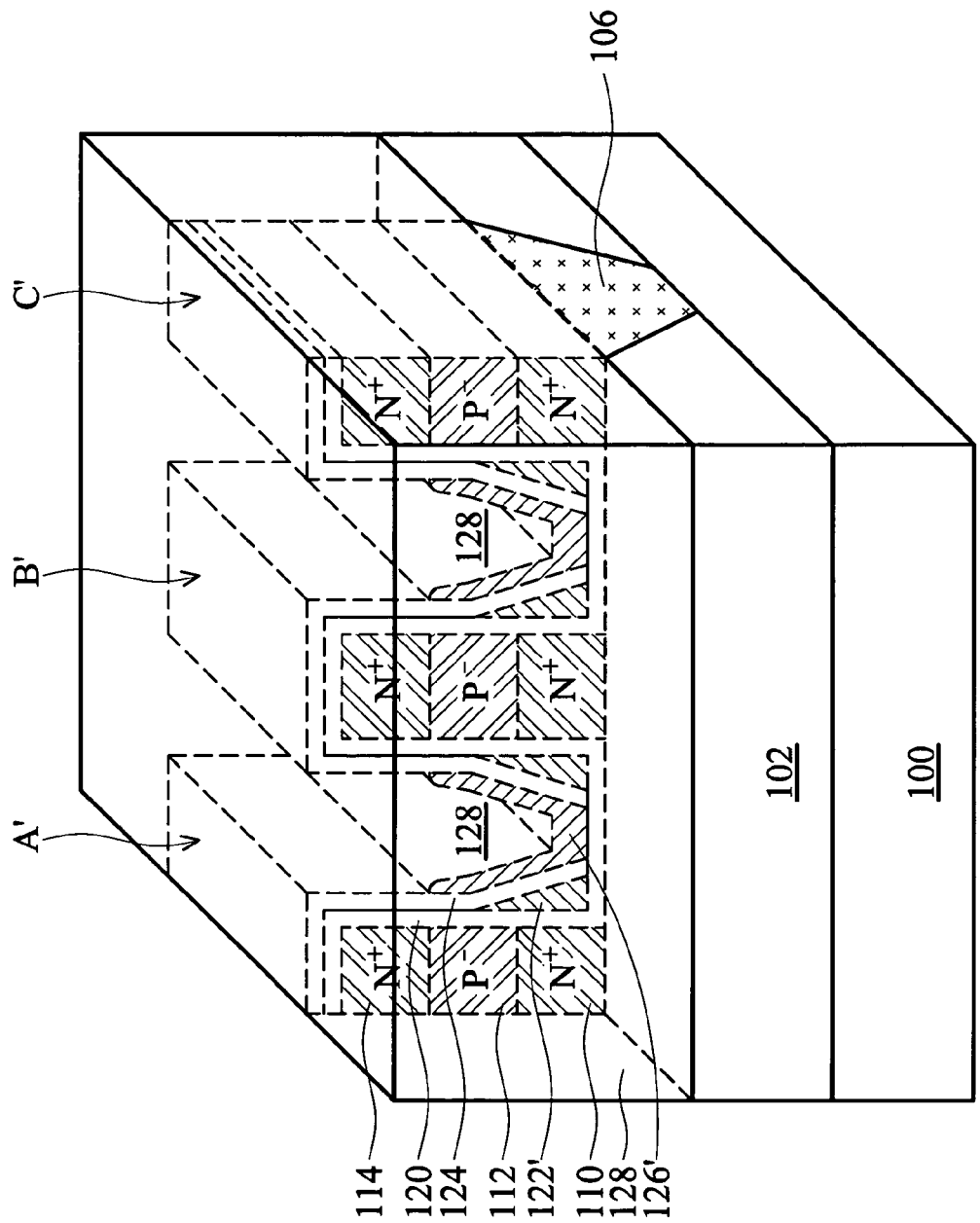

In FIG. 12, the surface of the substrate is covered with a first dielectric layer 128, such as HDP oxide deposited by high density plasma CVD (HDP-CVD), to fill the gaps between every two transistor bodies. The dielectric layer 128 is then planarized by chemical mechanical polishing (CMP).

Figure 13:
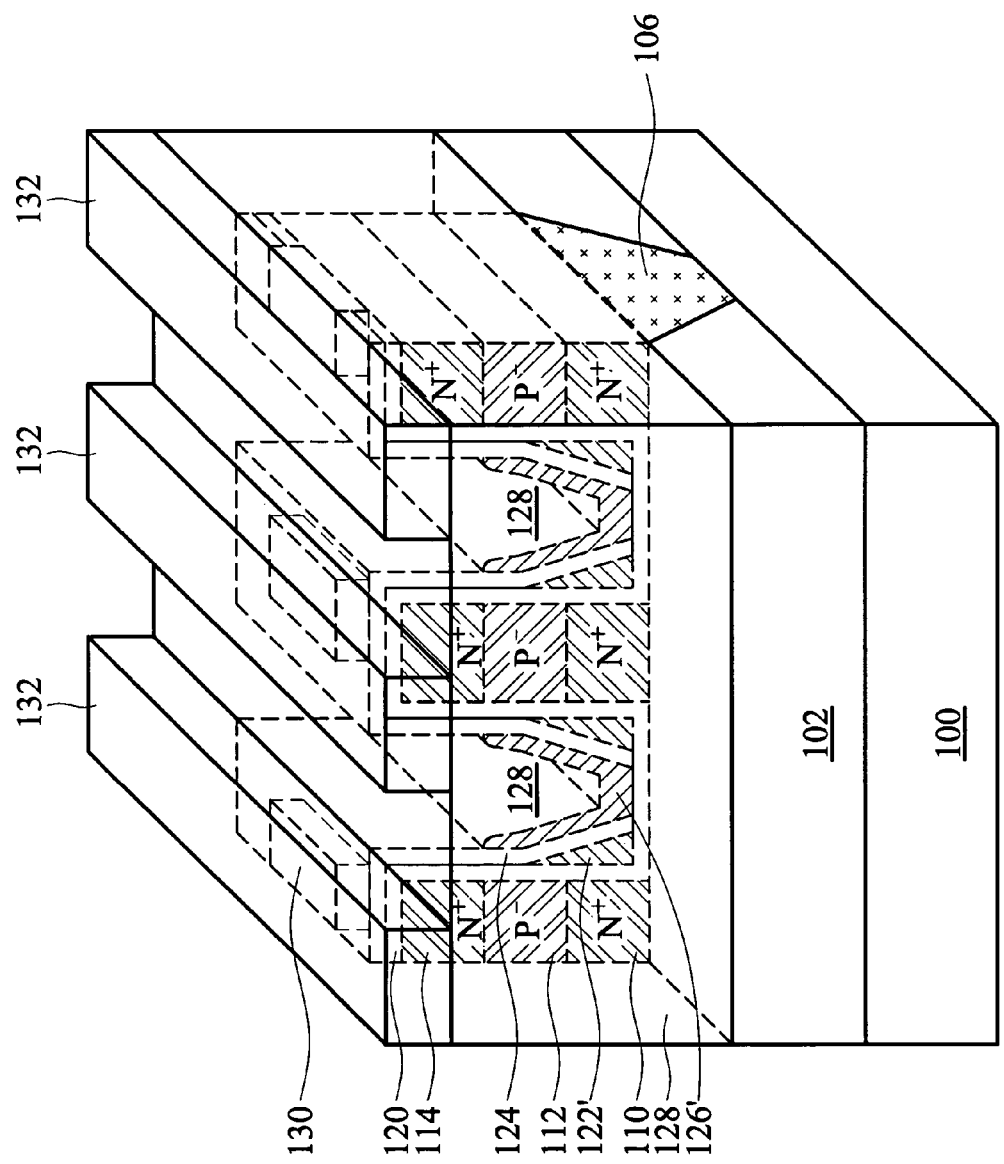

After vertical flash memory cells are isolated by the dielectric layer 128, contact holes 130 are formed on top of transistor bodies A', B' and C' respectively, penetrating the control gate oxide 124 and tunnel oxide layer 120, and exposing the underlying drain layer 114. A conductive material, such as tungsten, aluminum or copper, is then deposited over the surface of the dielectric layer 128 and fills the contact holes 130 as bit line contact plugs simultaneously. The conductive layer on the surface of the dielectric layer 128 is subsequently etched to form parallel conductive lines on the top of the transistor bodies A', B', and C', respectively, serving as bit lines 132 and perpendicular to the underlying source line 106, as shown in FIG. 13.

Figure 14:
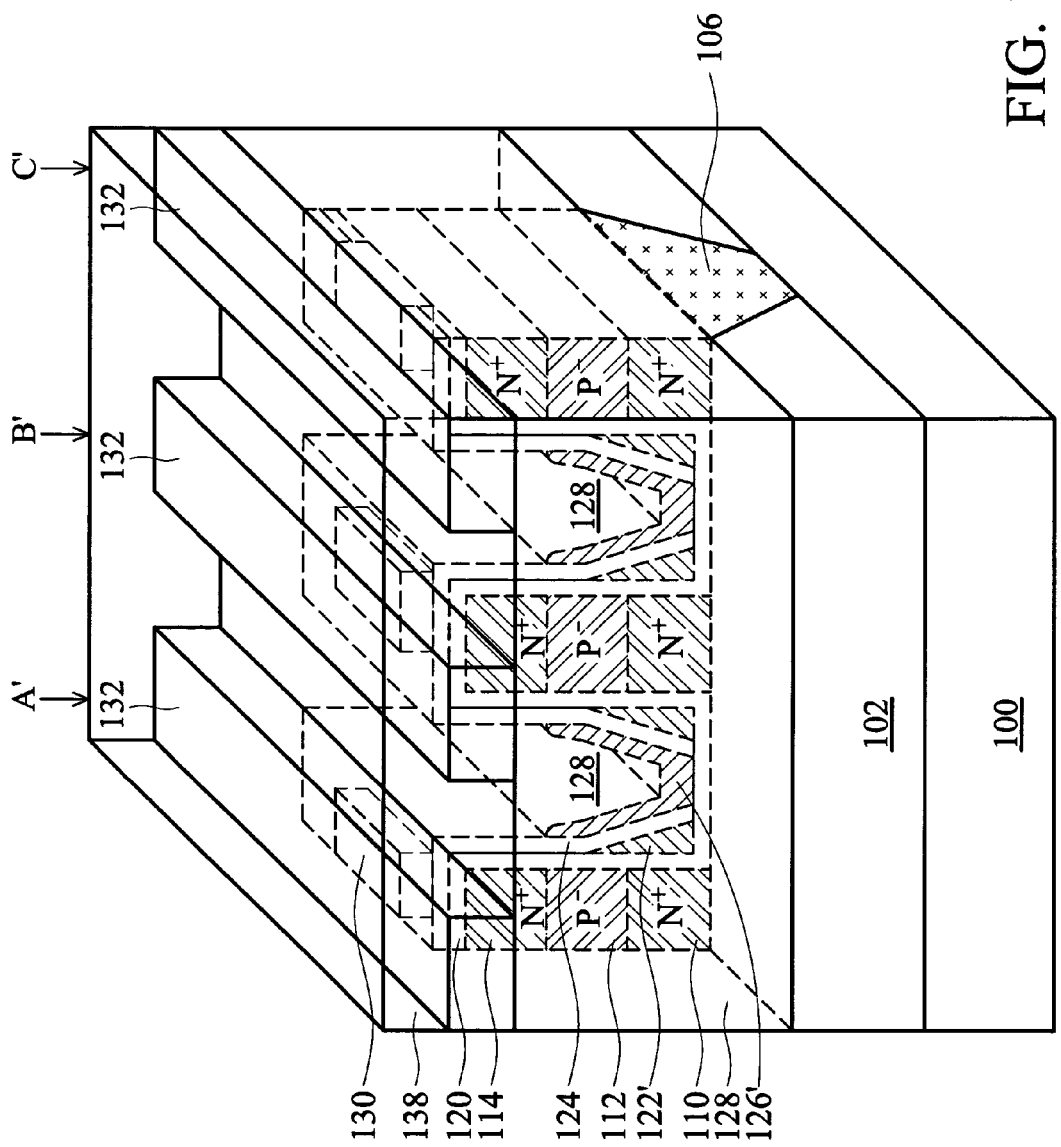

In FIG. 14, a second dielectric layer 138 is blanket-deposited on the surface of the substrate, covering the bit lines 132 and filling the gaps between them, as an insulating layer. Preferably, the dielectric layer 138 is planarized to form a flat surface.

Figure 15:
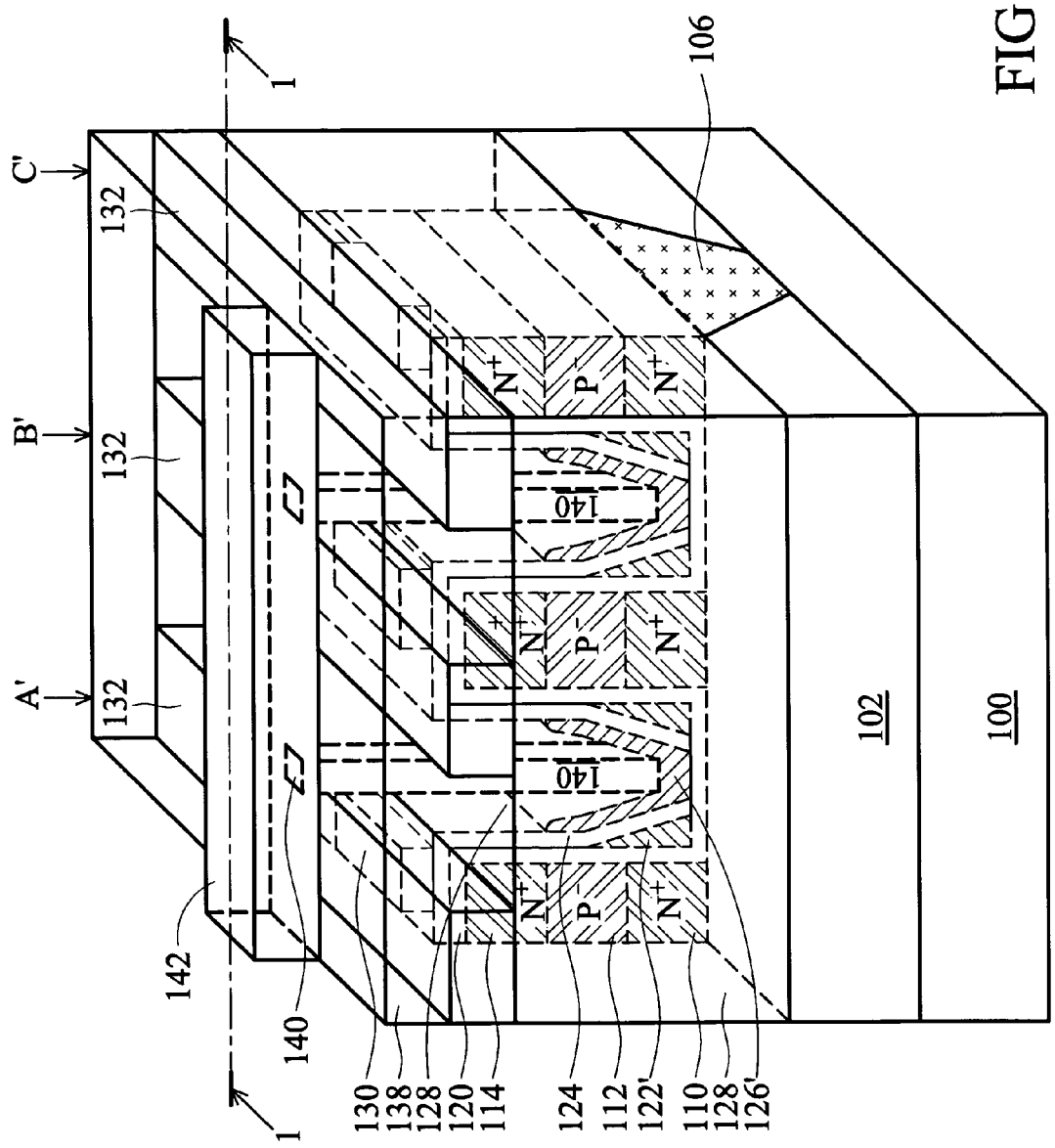

In FIG. 15, contact holes 140 are formed in the dielectric layers 138 and 128, exposing the control gates 126' on the underside of every two adjacent transistor bodies. A conductive material, such as tungsten, aluminum or copper, is then deposited over the surface of the oxide layer 138 and fills the contact holes 140 as word line contact plugs simultaneously. The conductive layer on the surface of the dielectric layer 138 is subsequently etched to form a conductive line connecting the word line contact plugs 140, serving as a word line (WL) 142, perpendicular to the bit lines 132 and parallel to the underlying source line 106, as shown in FIG. 15.

Figures 16A, 16B:
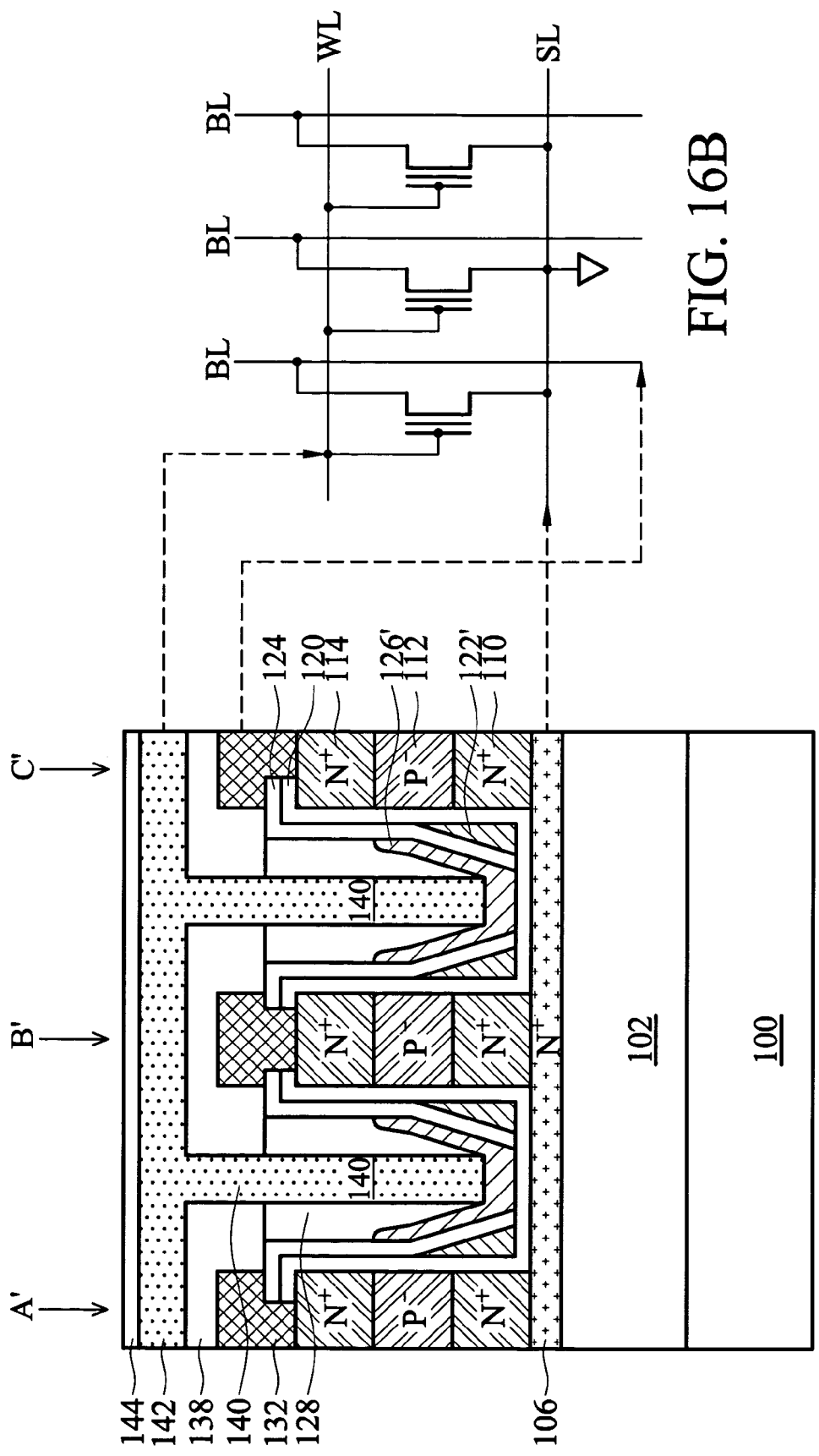
FIG. 16A shows a cross-section of the partial array of vertical flash memory cells shown in FIG. 15 along line 1-1 direction.
FIG. 16B shows a partial matrix of the vertical flash memory cells as shown in FIG. 16A.

FIG. 16A is a cross-section of the partial array of vertical flash memory cells shown in FIG. 15 along line 1-1. FIG. 16B shows a corresponding partial matrix of the vertical flash memory cells shown in FIG. 16A. As shown in FIG. 16A, the n-doped silicon layers 110 and 114 separated by a p-doped silicon layer 112 in the transistor bodies A', B' or C' function as a source and drain region respectively. The source region 110 contacts the underlying n-doped polysilicon source line (SL) 106. The drain regions 114 are connected to bit lines (BL) 132 via BL contact plugs. The p-doped silicon layer 112 serves as an n-type channel of a transistor body. The gate electrode of every flash memory cell comprises a joint tunnel dielectric 120, a floating gate 122', a joint control gate oxide 124 and a joint control gate 126', sequentially disposed on two opposite sidewalls of a vertical transistor body, wherein two opposite flash memory cells between two adjacent transistor bodies share a joint tunnel dielectric 120, a joint control gate oxide 124 and a joint control gate 126'. Each joint control gate 126' between two adjacent transistor bodies is connected to a word line 142 via WL contact plugs 140. An insulating or a passivation layer 144 is formed on the word line 142 is formed on the dielectric layer 138, isolating the word line 14 from outside. FIG. 16B is a schematic drawing showing the vertical flash memory cells connected by word line 142, bit lines 132 and source line 106 to form an array of flash memory cells.

TABLE 1

| State | Read | Program | Erase |
|---|---|---|---|
| Bit Line (BL) | 0.5-1 V | 0.5-1 V | 0 V |
| Word Line (WL) | 2-3 V | 1.5-2 V | <0 V |
| Source Line (SL) | 0 V | 10-12 V | 12-15 V |
| Electron path | Drain to Source | Source Injection to floating gate | Floating gate tunneling to source |

Table 1 shows operating conditions of the vertical flash memory cells in FIG. 15 of the present invention.

Figure 17B:
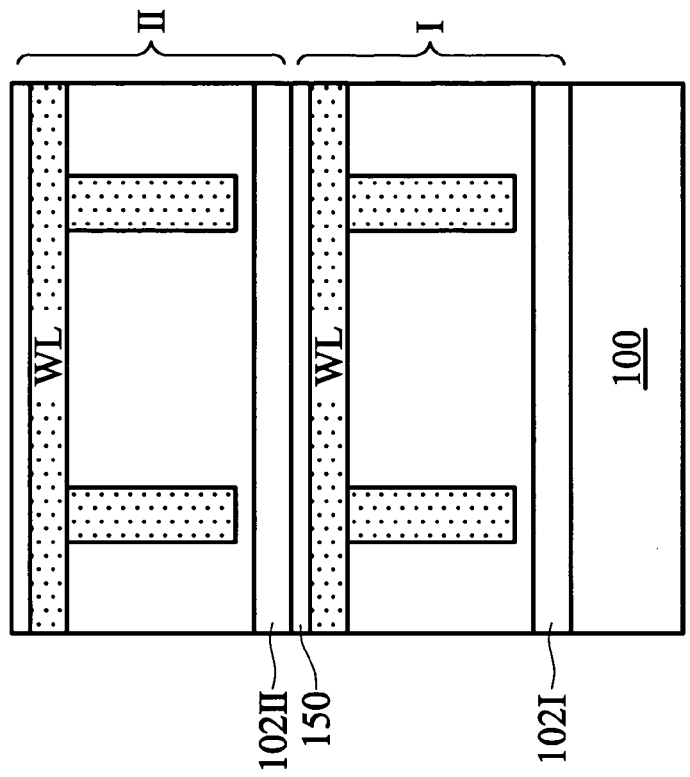
FIGS. 17A and 17B show stack structures of two levels of the arrays of the vertical flash memory cells shown in FIG. 16A.
Figure 17A:
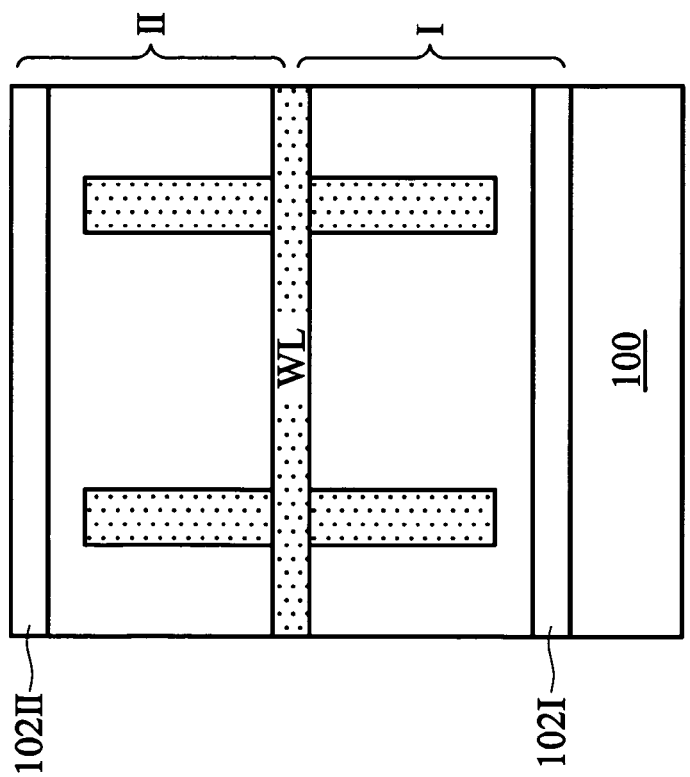

The vertical flash memory cells according to the invention are stackable. FIGS. 17A and 17B show two types of schematic stack structures of the vertical flash memory cells according to the invention. The top of the array of the vertical flash memory cells is hereinafter defined as the side with word lines. Accordingly, the underside of the array of the vertical flash memory cells is hereinafter defined as the side with source lines.

FIG. 17A shows a top-to-top stack structure. A first level of an array of the vertical memory cells I is formed on a substrate 100 as a base. A second level II of an identical array of the vertical memory cells is then formed inversely, i.e. upside down, on the surface of the first level array I to form a top-to-top structure as shown in FIG. 17A. Preferably, the first level I of the array of the vertical memory cells can share word lines (WL) with the second level cells II.

FIG. 17B shows a normal top-down stack structure. A first level of an array of the vertical memory cells I is formed on a substrate 100 as a base. Preferably, an isolation layer 150 is formed covering the surface of the first level I. A second level II of an identical array of the vertical memory cells is then fabricated on the isolation layer 150, as FIGS. 2 to 15 show, to form a top-down structure as shown in FIG. 17B. Thus, the vertical transistor body of the invention provides stackable arrays of flash memory cells. The number of stacked levels depends on device design.

The vertical memory cell, the array of the vertical memory cell or the multi-level structure of flash memory arrays of the invention can further be introduced into an electronic system to cooperate with a processor to perform any specific function.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory device, comprising:
   a memory cell, which comprises:
   a substrate with a first insulating layer disposed thereon;
   a source region, channel region and drain region stacked on the substrate sequentially as a transistor body;
   a tunnel dielectric layer on a sidewall of the transistor body;
   a floating gate disposed on the tunnel dielectric layer;
   a second insulating layer covering the floating gate;
   a control gate disposed on the second insulating layer, isolated from the floating gate by the second insulating layer and from the transistor body by the tunnel dielectric layer;
   a bit line electrically connected to the top of the transistor body via a bit line contact plug;
   a word line electrically connected to the control gate via a word line contact plug, wherein the bit line and word line are isolated by a third insulating layer; and
   a source line disposed in the first insulating layer of the substrate, in contact with the source region,
   wherein the top of the floating gate is between the upper and bottom surface of the channel regions and the top of the control gate is not over the upper surface of the channel region.

2. The flash memory device as claimed in claim 1, wherein the source and the drain regions are composed of n-doped polysilicon or n-doped epitaxial silicon and the channel region is composed of p-doped polysilicon or p-doped epitaxial silicon.

3. The flash memory device as claimed in claim 1, wherein the floating gate and control gate are isolated from the substrate by the tunnel dielectric layer.

4. The flash memory cell as claimed in claim 1, wherein the control gate and/or floating gate comprise polysilicon.

5. The flash memory device as claimed in claim 1, further comprising a dielectric layer covering the control gate.

6. The flash memory device as claimed in claim 1, further comprising:
a pair of the memory cells with a pair of the transistor bodies,
wherein the tunnel dielectric layer is on sidewalls of the pair of transistor bodies, a pair of the floating gates disposed on the tunnel dielectric layer that is on the opposite sidewalls of the pair of transistor bodies, the insulating layer covers the pair of the floating gates and the control gate disposed on the insulating layer as a joint control gate of the pair of the memory cells.

7. An array of flash memory cells on a substrate, comprising:
an array of transistor bodies on the substrate, each comprising a source region, a channel region and a drain region, stacked on the substrate in sequence, wherein each transistor body has a top surface and a pair of sidewalls;
two joint gate structures disposed on two opposite sidewalls of every two adjacent transistor bodies respectively, including:
a joint tunnel dielectric layer disposed conformally on the opposite sidewalls of the two transistor bodies and the substrate between the transistor bodies;
two floating gates disposed on the opposite sidewalls of the tunnel dielectric layer respectively and above the source and channel regions, wherein the top of each floating gate is between the upper and bottom surface of the channel regions;
a joint insulating layer conformally covering the two opposite floating gates between the two transistor bodies and the substrate there between; and
a joint control gate layer disposed over the opposite sidewalls of the transistor bodies and the substrate there between, isolated from the floating gates by the insulating layer and from the transistor bodies by the tunnel dielectric layer, wherein the top of each control gate is not over the upper surface of the channel region;
a dielectric layer substantially filling gaps between the transistor bodies and covering the surface of the transistor bodies;
a plurality of bit lines disposed in the dielectric layer, in contact with the top surfaces of the transistor bodies;
a plurality of word lines disposed in the dielectric layer, in contact with the control gates on the bottom of every two adjacent transistor bodies via word line contact plugs; and
a plurality of source lines disposed in the substrate, in contact with the source regions of the transistor bodies.

8. The array of flash memory cells as claimed in claim 7, wherein the source and drain regions comprise n-doped polysilicon or n-doped epitaxial silicon and the channel region comprises p-doped polysilicon or p-doped epitaxial silicon.

9. The array of flash memory cells as claimed in claim 7, wherein the floating gates and/or control gate layers comprise polysilicon.

10. The array of flash memory cells as claimed in claim 7, wherein the dielectric layer further comprises a first dielectric layer substantially filling the gap between every two transistor bodies, and a second dielectric layer substantially covering the first dielectric layer and the transistor bodies.

11. An electronic system, comprising:
a processor; and
a memory device connected to the processor, including an array of flash memory cells as claimed in claim 7.

12. A multi-level structure of flash memory arrays, comprising:
a substrate;
a first level of an array of flash memory cells as claimed in claim 7 on the substrate; and
a second level of an array of flash memory cells as claimed in claim 7 disposed on the dielectric layer of the first level of an array of flash memory cells.

13. The multi-level structure of flash memory arrays as claimed in claim 12, wherein the second level of the flash memory array is inversely disposed on the first level.

* * * * *